(12) United States Patent
Bowles et al.

(10) Patent No.: US 7,541,866 B2
(45) Date of Patent: Jun. 2, 2009

(54) ENHANCED DOHERTY AMPLIFIER WITH ASYMMETRICAL SEMICONDUCTORS

(75) Inventors: Gregory Bowles, Nepean (CA); Martin O'Flaherty, Bishop's Stortford (GB); Scott Widdowson, Ottawa (CA); John Ilowski, Nepean (CA)

(73) Assignee: Nortel Networks Limited, St. Laurent (CA)

( * ) Notice: Subject to any disclaimer, the term of this patent is extended or adjusted under 35 U.S.C. 154(b) by 72 days.

(21) Appl. No.: 11/537,084

(22) Filed: Sep. 29, 2006

(65) Prior Publication Data

US 2008/0088369 A1    Apr. 17, 2008

(51) Int. Cl.
*H03F 3/68* (2006.01)
(52) U.S. Cl. .................................. 330/124 R; 330/295
(58) Field of Classification Search ............. 330/124 R, 330/295, 84, 126
See application file for complete search history.

(56) References Cited

U.S. PATENT DOCUMENTS

| | | | | |
|---|---|---|---|---|
| 6,639,464 | B2 * | 10/2003 | Hellberg | 330/124 R |
| 6,700,444 | B2 * | 3/2004 | Pengelly | 330/295 |
| 6,703,897 | B2 | 3/2004 | O'Flaherty et al. | |
| 6,897,721 | B2 | 5/2005 | Hellberg | |
| 6,922,102 | B2 * | 7/2005 | Myer et al. | 330/51 |
| 7,038,539 | B2 | 5/2006 | Khanifar et al. | |
| 7,053,706 | B2 * | 5/2006 | Kwon et al. | 330/124 R |
| 7,061,314 | B2 | 6/2006 | Kwon et al. | |
| 7,064,606 | B2 * | 6/2006 | Louis | 330/124 R |
| 7,148,746 | B2 * | 12/2006 | Louis | 330/124 R |
| 7,193,473 | B2 * | 3/2007 | Pengelly et al. | 330/295 |
| 7,304,537 | B2 * | 12/2007 | Kwon et al. | 330/124 R |

OTHER PUBLICATIONS

Tongchoi, C., et al., "Lumped Element Based Doherty Power Amplifier Topology in CMOS Process," Mahanakorn University of Technology, Bangkok, Thailand, IEEE, 2003, pp. I-445-I-448.
Zhao, Y., et al., "A 900MHz Doherty Amplifier Implemented with Lumped Elements," University of California, San Diego, Jun. 15, 2006, 14 pgs.
Gajadharsing, J.R., et al., "Analysis and design of a 200 W LDMOS based Doherty amplifier for 3 G base stations," IEEE Xplore® Release 2.1, http://ieeexplore.ieee.org/xpl/freeabs_all.jsp?tp=&arnumber=1336032&isnumber=29472, Jun. 16, 2006, 1 pg.
U.S. Appl. No. 11/563,535, filed Nov. 27, 2006, entitled "Enhanced Amplifier with Auxiliary Path Bias Modulation."
Foreign communication from a related counterpart application—International Search Report and Written Opinion, PCT/US07/079730, Sep. 3, 2008, 8 pages.

* cited by examiner

*Primary Examiner*—Henry K Choe
(74) *Attorney, Agent, or Firm*—Conley Rose, P.C.; Rodney B. Carroll; Bernard Tiegerman

(57) ABSTRACT

The present discloses an amplification unit which comprises a first amplifier and a second amplifier connected in parallel, the first amplifier and the second amplifier comprising semiconductor devices that are not the same amplifier design. The present application also discloses a signal input line connected to the first amplifier and the second amplifier. A signal output line is also disclosed which is connected to the first amplifier and the second amplifier.

7 Claims, 14 Drawing Sheets

ENHANCED DOHERTY AMPLIFIER WITH ASYMMETRICAL SEMICONDUCTORS

CROSS-REFERENCE TO RELATED APPLICATIONS

Not Applicable.

STATEMENT REGARDING FEDERALLY SPONSORED RESEARCH OR DEVELOPMENT

Not applicable.

REFERENCE TO A MICROFICHE APPENDIX

Not applicable.

FIELD OF THE INVENTION

The present invention relates generally to signal amplification and, more particularly, to a device and method for increasing the efficiency of an amplification device.

BACKGROUND OF THE INVENTION

Wireless devices use Radio Frequencies (RF) to transmit information. For example, cell phones use amplified RF to transmit voice data to base stations, which allow signals to be relayed to communications networks. Other existing wireless communication devices include Bluetooth, HomeRF and WLAN. In a conventional wireless device, the power amplifier consumes most of the power of the overall wireless system. For systems that run on batteries, a power amplifier with a low efficiency results in a reduced communication time for a given battery life. For continuous power systems, a decrease in efficiency results in increased power usage and heat removal requirements, which may increase the equipment and operating costs of the overall system.

For this reason, much effort has been expended on increasing the efficiency of RF power amplifiers. One type of amplifier that may increase power amplifier efficiency is a Doherty-type power amplifier. A common Doherty-type power amplifier design includes a main amplifier and an auxiliary amplifier. The main amplifier is operated to maintain optimal efficiency up to a certain power level and allows the auxiliary amplifier to operate above that level. When the power amplifier is operated at a high output power level, the main amplifier will be heavily compressed such that non-linearities are introduced into the amplified signal. In common Doherty-type amplifiers, the main and auxiliary amplifiers are composed of the same type of amplifiers with the same power amplification rating. These Doherty-type amplifiers develop an efficiency peak 6 dB back of full power which in theory will be equal in magnitude to the maximum efficiency of the system. However, new amplifier architectures and device technologies allow for designs wherein the location of the efficiency peak in back-off may be moved about the traditional 6 dB point and wherein magnitudes exceed the maximum compressed system efficiency. Due to the importance and widespread use of wireless technologies, it would be desirable to have a Doherty-type device capable of an increased efficiency over a wide range of power amplification levels.

SUMMARY OF THE INVENTION

The present disclosure contemplates an amplification unit comprising a first amplifier and a second amplifier connected in parallel, the first amplifier and the second amplifier comprising semiconductor devices that are not the same amplifier design. The amplification unit also has a signal input line connected to the first amplifier and the second amplifier, and a signal output line connected to the first amplifier and the second amplifier.

The present disclosure further contemplates a base station comprising a signal controller, a transmitter and receiver, an antenna, and an amplification unit. The amplification unit further comprises a first amplifier and a second amplifier connected in parallel, and the first amplifier and the second amplifier comprise semiconductor devices that are not of the same amplifier design. The amplification unit also comprises a signal input line connected to the first amplifier and the second amplifier, and a signal output line connected to the first amplifier and the second amplifier.

A method is disclosed for amplifying an input signal that comprises separating the input signal into a first portion and a second portion, amplifying the first portion using a first amplifier and the second portion using a second amplifier, and reintegrating the amplified first portion and the amplified second portion. In the disclosed method, the first amplifier and second amplifier comprise semiconductor devices that are not of the same amplifier design.

Other aspects and features of the present invention will become apparent to those ordinarily skilled in the art upon review of the following description of specific embodiments of the invention in conjunction with the accompanying figures.

DETAILED DESCRIPTION OF THE PREFERRED EMBODIMENTS

It should be understood at the outset that although an exemplary implementation of one embodiment of the present disclosure is illustrated below, the present system may be implemented using any number of techniques, whether currently known or in existence. The present disclosure should in no way be limited to the exemplary implementations, drawings, and techniques illustrated below, including the exemplary design and implementation illustrated and described herein, but may be modified within the scope of the appended claims along with their full scope of equivalents.

Figure 1:
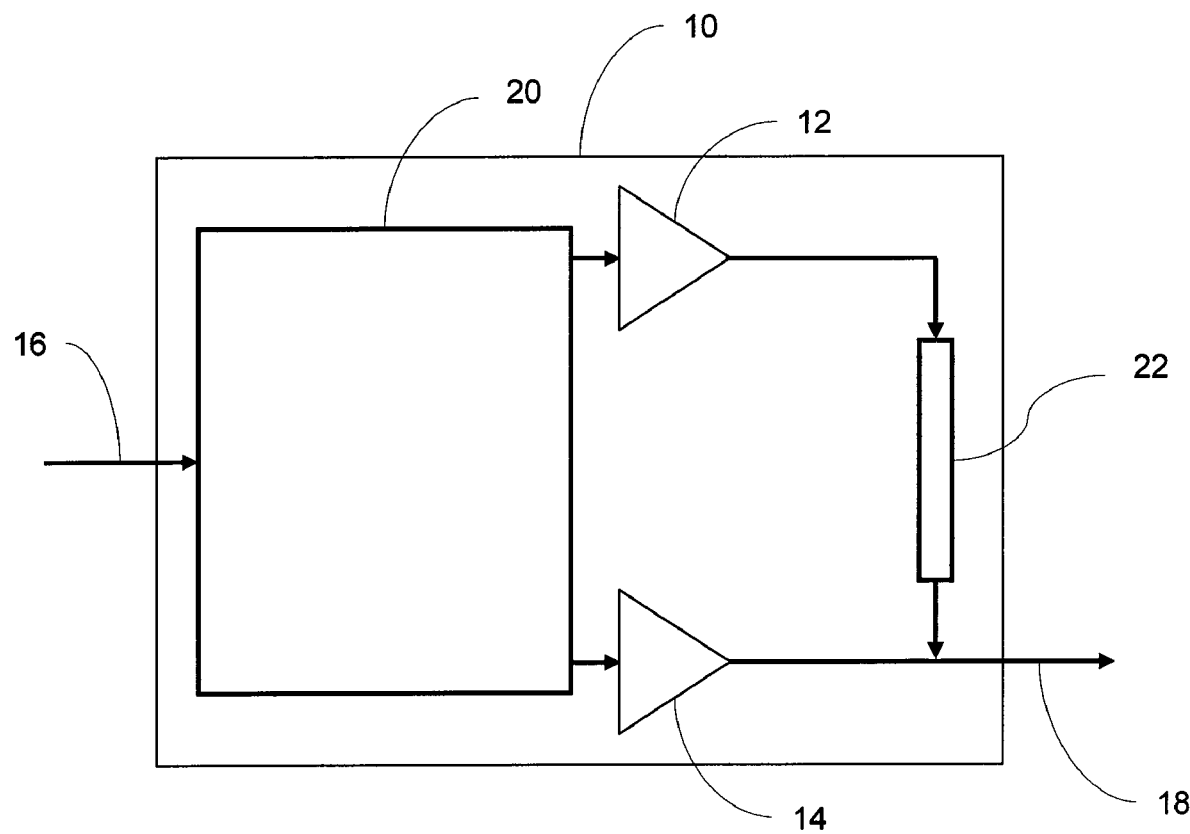
FIG. 1 is a block diagram of an enhanced amplification unit.

As shown in FIG. 1, the present disclosure contemplates an enhanced amplification unit 10, which in some embodiments is configured in a design consistent with a Doherty-type amplifier. The enhanced amplification unit 10 comprises an input signal line 16, a main amplifier 12, an auxiliary amplifier 14, a signal preparation unit 20, a main amplifier impedance transformer 22, and an output signal line 18. An input signal is passed into input signal line 16 and into signal preparation unit 20. Signal preparation unit 20 transmits the input signal from input signal line 16 into main amplifier 12, and signal preparation unit 20 phase shifts the input signal from input signal line 16 and transmits the phase shifted signal to auxiliary amplifier 14. Main amplifier impedance transformer 22 receives output from main amplifier 12. Output from auxiliary amplifier 14 and the main amplifier impedance transformer 22 are combined to form an output signal that is transmitted to signal output line 18.

In some embodiments, the phase shift introduced by signal preparation unit 20 is corrected in main amplifier impedance transformer 22, so that the signal exiting main amplifier impedance transformer 22 is in phase with the signal that exits auxiliary amplifier 14. In order to enhance the efficiency of enhanced amplification unit 10, main amplifier 12 and auxiliary amplifier 14 may be semiconductor devices of different material compositions, different designs, or both different material compositions and different designs. The use of a first semiconductor device for main amplifier 12 and a second semiconductor device for the auxiliary amplifier 14, wherein the first semiconductor device is not the same as the second semiconductor device, can be used to enhance the efficiency of enhanced amplification unit 10. It is understood that while an impedance transformer is used in this embodiment, any device capable of introducing an offset, in some embodiments that offset being a 90 degree offset, could be used. It is further understood that as used herein, terms such as coupled, connected, electrically connected, in signal communication, and the like may include direct connections between components, indirect connections between components, or both, as would be apparent in the overall context of a particular embodiment. The term coupled is intended to include, but not be limited to, a direct electrical connection. The terms transmit, transmitted, or transmitting is intended to include, but not be limited to, the electrical transmission of a signal from one device to another.

Signal preparation unit 20 is capable of splitting, dividing, or otherwise providing to main amplifier 12 and auxiliary amplifier 14 a signal either directly from input signal line 16, or a signal that has been modified by another component, structure, or device using input signal line 16 as a source. Signal preparation unit 20 may be embodied as any device capable of passing at least part of a signal from input signal line 16 to main amplifier 12 and auxiliary amplifier 14. Signal preparation unit 20 may pass the same signal to both main amplifier 12 and auxiliary amplifier 14, or may pass a modified signal to main amplifier 12, auxiliary amplifier 14, or both main amplifier 12 and auxiliary amplifier 14. Signal preparation unit 20 is further capable, in some embodiments, of introducing a phase change into the signal from input signal line 16 which is passed to main amplifier 12, auxiliary amplifier 14, or both main amplifier 12 and auxiliary amplifier 14. Signal preparation unit 20 is illustrated as an electronic device; however, it is expressly understood that in some embodiments signal preparation unit 20 may be replaced with a direct electrical connection between input signal line 16, main amplifier 12, and auxiliary amplifier 14.

In an embodiment, main amplifier 12 and auxiliary amplifier 14 comprise different semiconductor amplification devices. Main amplifier 12 and auxiliary amplifier 14 may each independently comprise any semiconductor technology or family capable of being used as an amplifier, including, but not limited to, lateral double-diffused metal oxide semiconductor (LDMOS), complementary metal oxide semiconductor (CMOS), metal oxide semiconductor field effect transistor (MOSFET), metal semiconductor field effect transistor (MESFET), heterojunction bipolar transistor (HBT), heterojunction field effect transistor (HFET), high electron mobility transistor (HEMT) and bipolar junction transistor (BJT). Material compositions of main amplifier 12 and auxiliary amplifier 14 may include, but are not limited to, silicon (Si), indium phosphide (InP), gallium arsenide (GaAs), and gallium nitride (GaN). In one embodiment, main amplifier 12 and auxiliary amplifier 14 are a set of mixed semiconductor devices whereby the material composition, semiconductor family, or both the material composition and semiconductor family of main amplifier 12 and auxiliary amplifier 14 are not the same (i.e., are different). Use of a main amplifier 12 having a different amplifier design from auxiliary amplifier 14 may enhance the operational efficiency of the amplification unit. For the sake of clarity, the phrase "amplifier design" shall refer to the semiconductor family and/or material composition of a particular amplifier. In addition, the power ratings of main amplifier 12 and auxiliary amplifier 14 may be different in order to change the location of the maximum efficiency in back-off of the enhanced amplification unit 10.

Figure 2:
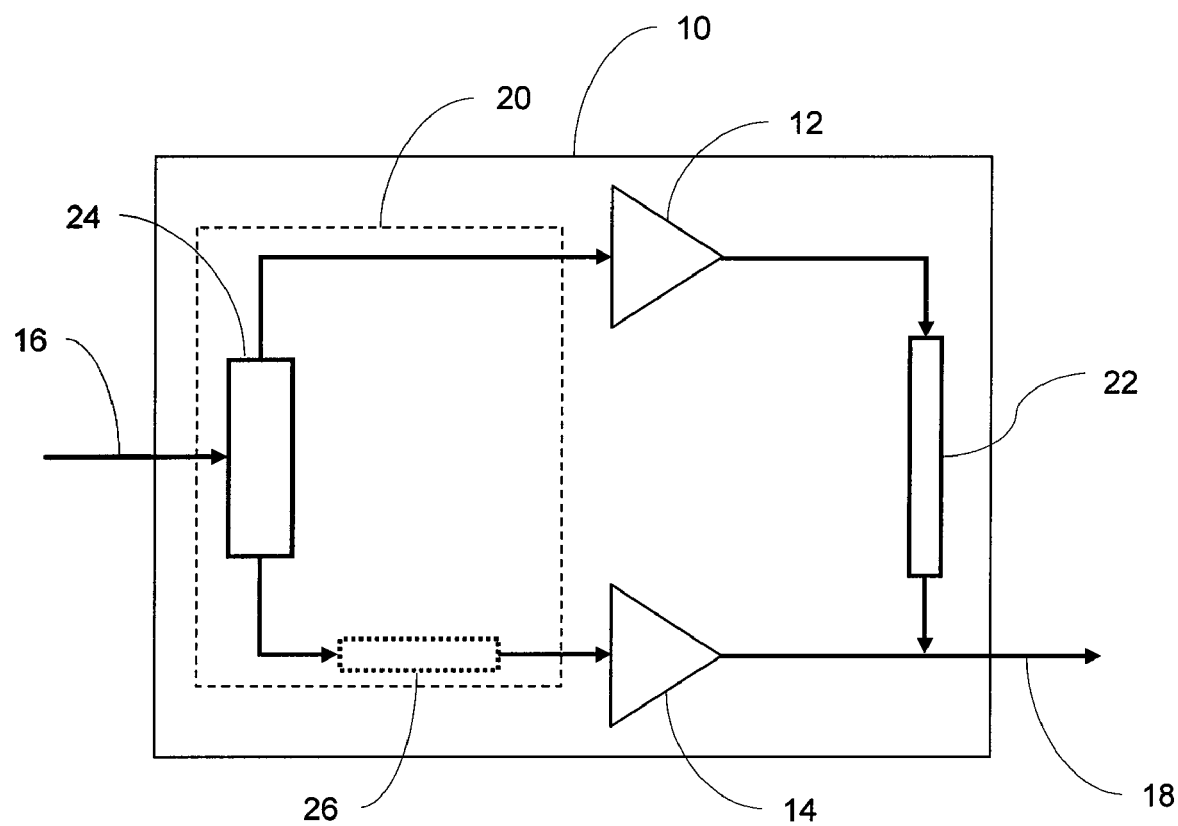
FIG. 2 is an expanded block diagram of an embodiment of an enhanced amplification unit.

FIG. 2 illustrates another embodiment of enhanced amplification unit 10. In this embodiment, enhanced amplification unit 10 contains a modified version of signal preparation unit 20. This modified version of signal preparation unit 20 contains a signal splitter 24 and an auxiliary path phase offset 26. In this embodiment, an input signal is introduced through input signal line 16, and transmitted into signal splitter 24. Signal splitter 24 splits the input signal, without modifying the input signal, into two substantially similar signals. One of the two signals leaving signal splitter 24 is passed into main amplifier 12 and the other signal leaving signal splitter 24 is passed into auxiliary path phase offset 26. Auxiliary path phase offset 26 introduces a phase shift to the signal from signal splitter 24, in some embodiments, that phase shift may be 90 degrees, and transmits this phase shifted signal into auxiliary amplifier 14. Main amplifier 12 receives a signal from signal splitter 24, amplifies this signal, and transmits this main amplifier amplified signal into main amplifier impedance transformer 22. Main amplifier impedance transformer 22 introduces a phase shift to the main amplifier amplified signal, which in some embodiments is a phase shift of substantially similarly qualities as the phase shift introduced by auxiliary path phase offset 26.

When signal splitter 24 splits the signal, it transmits the signal along a main path and an auxiliary path. The main path is the path in which main amplifier 12 is present which runs in between signal splitter 24 and output signal line 18. The auxiliary path is the path in which auxiliary amplifier 14 is present which runs in between signal splitter 24 and output signal line 18.

The output signal is transmitted through output signal line 18 and formed by main amplifier impedance transformer 22 and auxiliary amplifier 14. Quarter wavelength impedance transformers may be used as main amplifier impedance transformer 22 and signal preparation unit 20, and may function as phase shifters that may introduce phase change and impedance inversion. One of the innovative features is that by phase shifting both the output from main amplifier 12 and the input to auxiliary amplifier 14, the amplifiers may be driven in phase quadrature. The phrase phase quadrature is intended to refer to the state where two signals are out of phase by 90 degrees.

It is expressly understood that, in some embodiments, enhanced amplification unit 10 may be operated in a state that is shifted away from quadrature so as to ensure that the amplified signals combined in output signal line 18 are in phase to account for variations introduced by combining mixed semiconductor device technologies or materials or power ratings or bias conditions or any combination thereof.

In the embodiment shown in FIG. 2, main amplifier 12 is biased in Class AB, and auxiliary amplifier 14 is biased in Class C. Class A amplifiers conduct current at all times, Class B amplifiers are designed to amplify half of an input wave signal, and Class AB is intended to refer to the Class of amplifier which combines the Class A and Class B amplifier. As a result of the Class B properties, Class AB amplifiers are operated in a non-linear region that is only linear over half the wave form. Class C amplifiers are biased well beyond cutoff, so that current, and consequently the input signal, is amplified less than one half the duration of any given period. The Class C design provides higher power-efficiency than Class B operation but with the penalty of higher input-to-output non-linearity. One of the innovative features of the present disclosure teaches how to optimize the selection of different amplifier designs for main amplifier 12 and auxiliary amplifier 14 and use the properties of each amplifier class to design an efficient enhanced amplification unit 10.

One of the advantages of the disclosed enhanced amplification unit 10 is the increased efficiency created through the use of a first amplifier design for main amplifier 12 and a second amplifier design for auxiliary amplifier 14, wherein the first amplifier design and the second amplifier design are not the same. This efficiency is evident in the enhanced linearity of enhanced amplification unit 10. The efficiency of an amplifier may be measured by reference to the Power Added Efficiency (PAE). The PAE is defined as the difference between the amplifier input signal power and amplifier output signal power divided by the Direct Current (DC) power input to the amplifier. The PAE may be plotted as a function of output power (Pout), Pout is in decibels above 1 mill watt (dBm), as shown in FIGS. 3 and 4.

Figure 3:
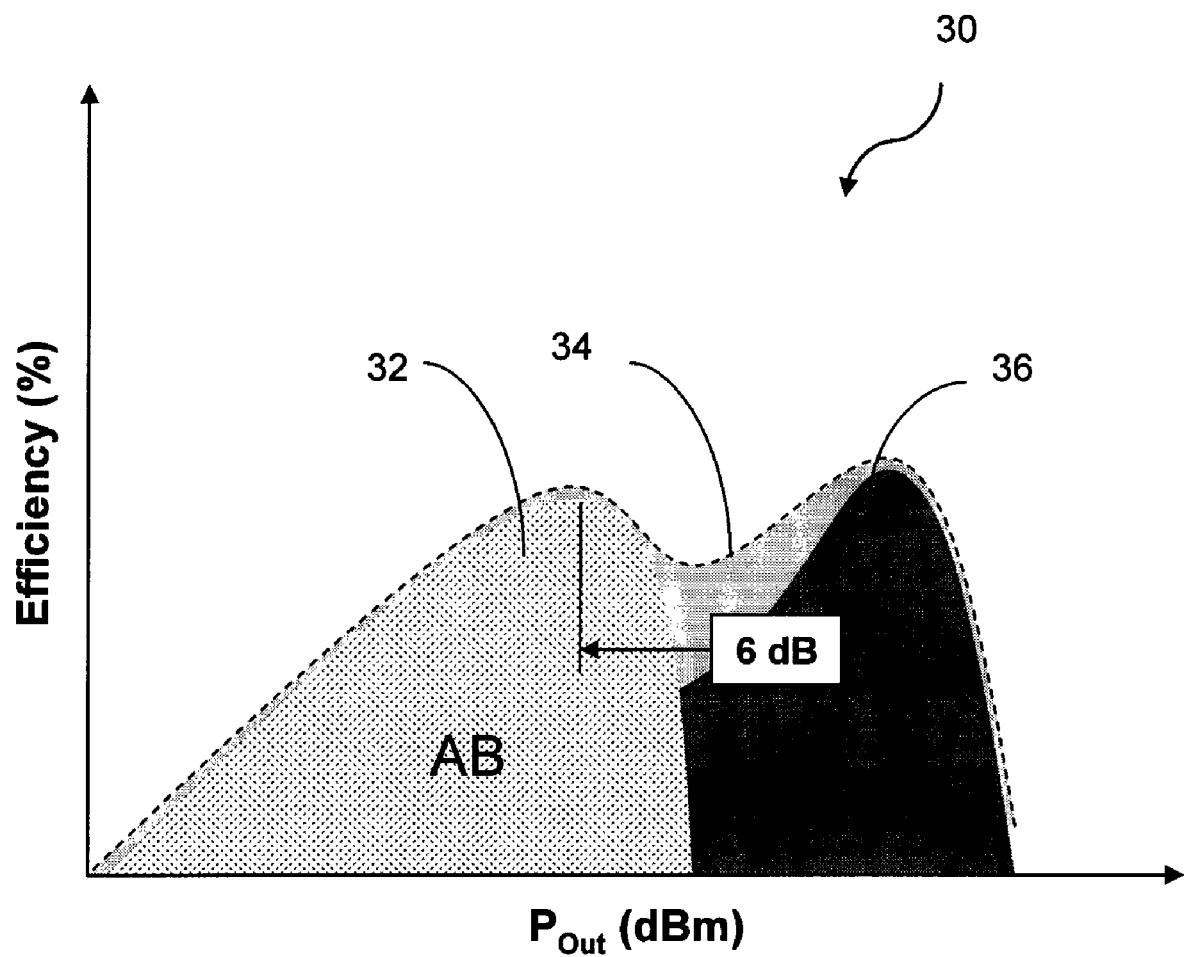
FIG. 3 is a graphical representation of an enhanced amplification unit efficiency curve.

FIG. 3 is an efficiency graph 30 of enhanced amplification unit 10, wherein main amplifier 12 and auxiliary amplifier 14 have identical, or substantially similar, physical amplifier designs but are biased in class AB and C, respectively. This figure shows a main amplifier output result 32 (class AB), an auxiliary amplifier output result 36 (class C), and the combination of main amplifier output result 32 and auxiliary amplifier output result 36 as a combined output result 34. The use of an amplifier design for main amplifier 12 with high efficiency creates an increase in the height of first efficiency result 32 without substantially affecting the amplifier linearity. Main amplifier 12 operates whenever enhanced amplification unit 10 is amplifying an input signal; an increase in the efficiency of main amplifier 12 improves the efficiency of enhanced amplification unit 10. Moreover, combined output result 34 demonstrates that the independent choice of amplifier designs for main amplifier 12 and auxiliary amplifier 14 allows for the development of enhanced efficiency by design in the back-off of the output, which is desirable in today's modulation systems.

Figure 4:
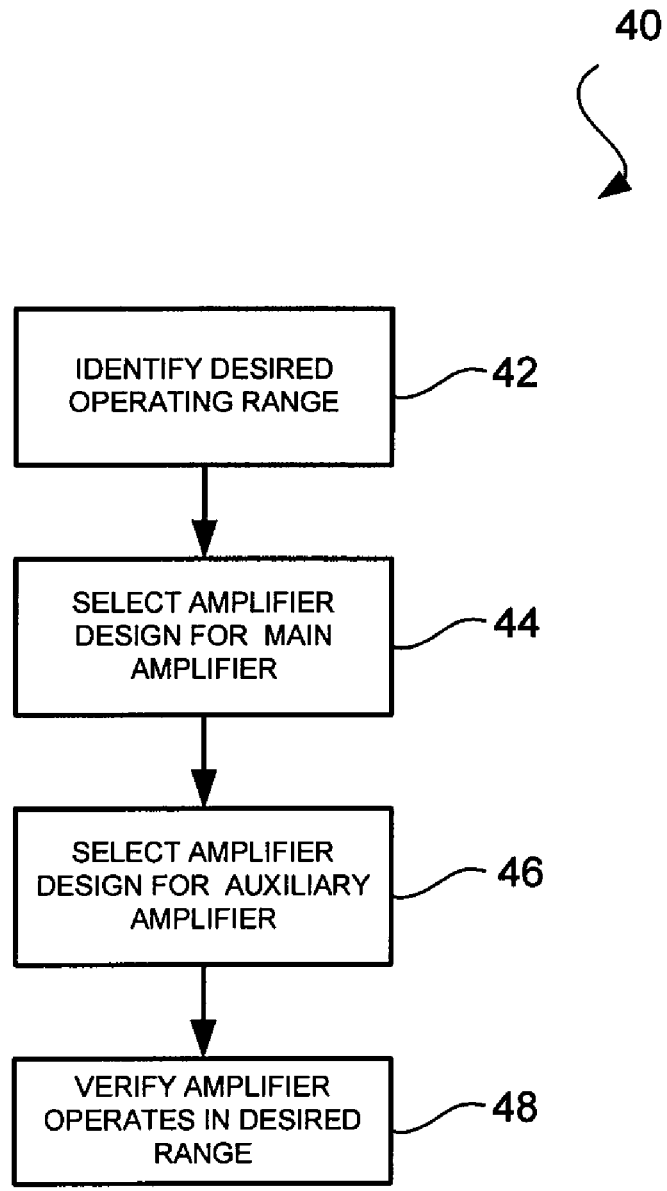
FIG. 4 is a flow chart of a method for selecting semiconductor devices for an enhanced amplification unit.

FIG. 4 illustrates a method for determining a first amplifier design 40 of main amplifier 12 and a second, different amplifier design of auxiliary amplifier 14 that may begin with identifying the desired operating range for enhanced amplification unit 10 (Block 42). Operating characteristics that may be used to determine the operating range include without limitation the power input level, power output level, operating Peak to Average Ratio (PAR), and frequency operating range. Once the desired operating range has been determined, the amplifier design for main amplifier 12 may be determined (Block 44). In general, main amplifier 12 materials may be selected such that main amplifier 12 will operate in a high efficiency range for the given enhanced amplification unit 10 operating range. In an embodiment, main amplifier 12 may be a GaAs HBT or a GaN HFET. The amplifier design for auxiliary amplifier 14 also may be determined (Block 46). Among other considerations in choosing an auxiliary amplifier 14 design may be a requirement that auxiliary amplifier 14 function as an open circuit with a high impedance when OFF, and have a turn ON point compatible with main amplifier 12 operating range. A CMOS or LDMOS device may exhibit the appropriate OFF characteristics for use as auxiliary amplifier 14. The design choices may then be verified to determine that they operate within the desired ranges (Block 48). Computer simulation or physical testing may be conducted to provide this verification. In various embodiments, main amplifier 12 may be a GaAs HBT, and auxiliary amplifier 14 may be a LDMOS; alternatively, main amplifier 12 may be a GaN HFET and auxiliary amplifier 14 may be a LDMOS; alternatively main amplifier 12 may be a GaAs HBT, and auxiliary amplifier 14 may be a CMOS; alternatively, main amplifier 12 may be a GaN HFET, and auxiliary amplifier 14 may be a CMOS.

Figure 5:
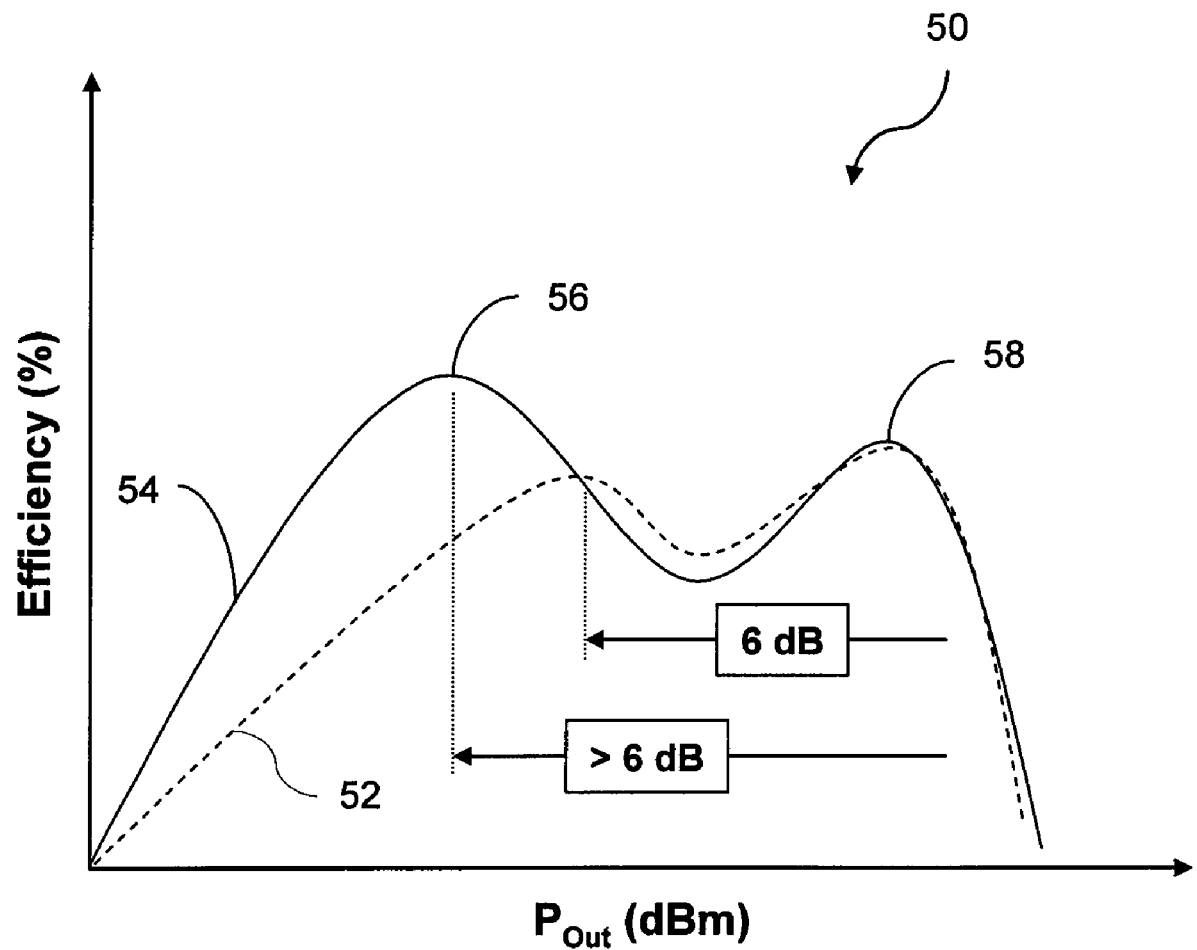
FIG. 5 is a graphical representation of several efficiency curves.

FIG. 5 is a graph 50 that shows some of the advantages of one embodiment of the present disclosure using an output result 54 from enhanced amplification unit 10, wherein, main amplifier 12 is a GaN HFET and auxiliary amplifier 14 is LDMOS. For output result 54, the power rating of main amplifier 12 is less than the power rating of auxiliary amplifier 14. Graph 50 also shows a second output result 52 from a Doherty amplifier with two identical LDMOS amplifiers. For output result 52, the combined power rating of the amplifiers is equivalent to the combined power rating for output result 54. The second output result 52 demonstrates a peak efficiency at 6 dB of back-off approaching that of the maximum efficiency in full compression 58, which reflects a design wherein identical devices are used. Output result 54 demonstrates peak efficiency at more than 6 dB back-off 56 that exceeds the maximum efficiency in full compression 58, which reflects the use of a smaller more efficient device as main amplifier 12. Furthermore, full power is still maintained through use of a proportionally larger auxiliary amplifier 14 such that combined power rating is equivalent to that for result 52. The choice of materials of enhanced amplification unit 10 are provided for illustrative purposes only, as any type and composition of device may be used as both main amplifier 12 and auxiliary amplifier 14. It is envisioned that, in this embodiment, main amplifier 12 and auxiliary amplifier 14 are capable of processing a signal with a frequency ranging from 800 MHz to 3.5 GHz, and can have a combined efficiency of greater than 30%; however, it is expressly contemplated that the disclosed embodiments may be used in any frequency range.

Another advantage illustrated by FIG. 5 is the complexity of enhanced amplification unit 10 first output result 54 as compared to the LDMOS amplifier second output result 52. The resulting enhanced amplification unit 10 output result 54 reflects the components of the contributing amplifier paths. This complex output path allows for the customization of output parameters based upon design choices previously unavailable without the variation in amplifier design. These output parameters include, but are not limited to, the customization of the peak to average signal to virtually any desired level.

Figure 6:
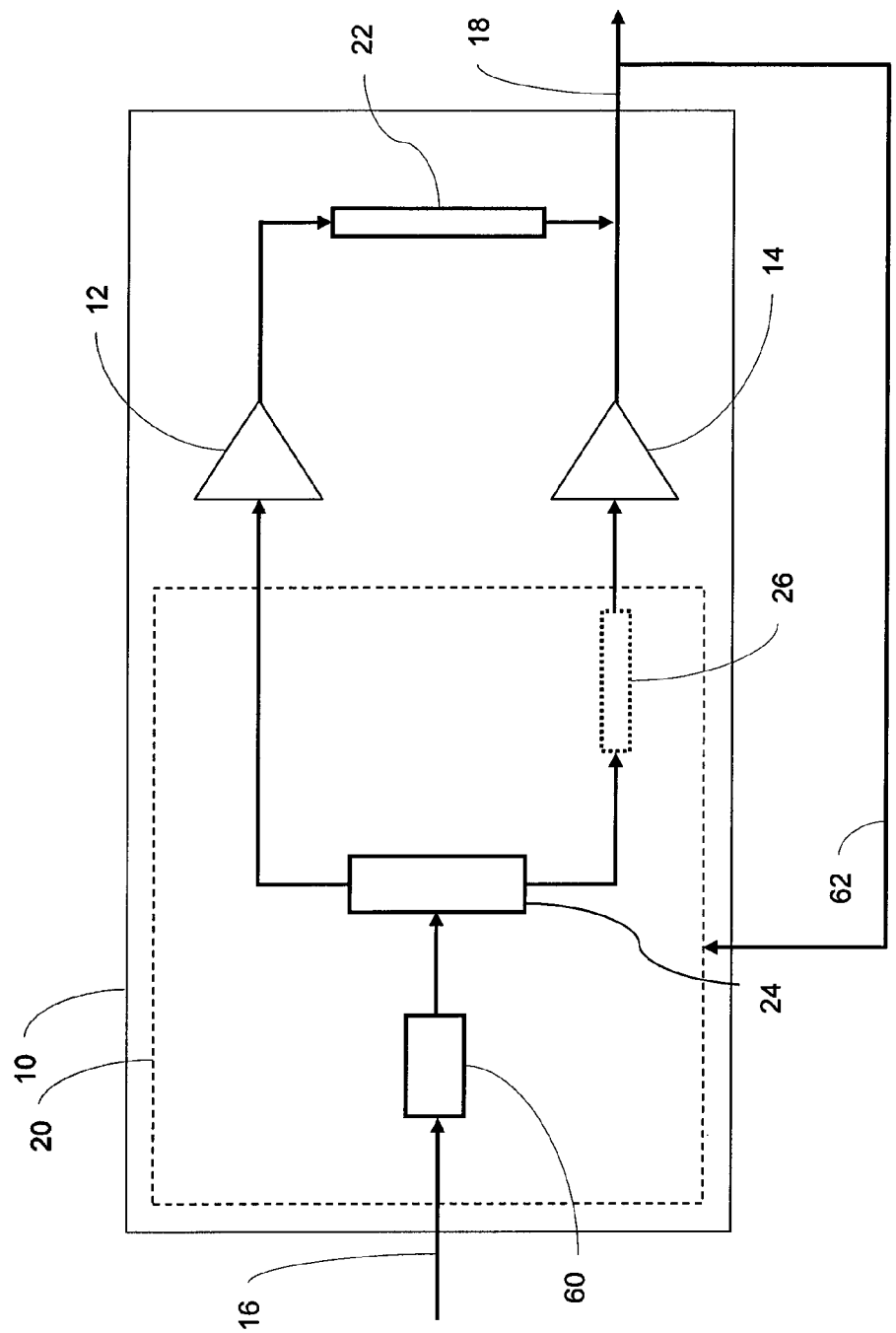
FIG. 6 is a block diagram of an alternative embodiment of an enhanced amplification unit with output signal feedback and a pre-distortion linearizer.

An embodiment of an enhanced amplification unit 10 is shown by FIG. 6. This embodiment of enhanced amplification unit 10 also has a main amplifier 12 and auxiliary amplifier 14 connected in parallel, a main amplifier impedance transformer 22 connected to main amplifier 12 and auxiliary amplifier 14, and an output signal line 18 connected to auxiliary amplifier 14 and main amplifier impedance transformer 22. Again, the amplifier designs of the main and auxiliary amplifiers are dissimilar. In this embodiment, a signal is introduced through an input signal line 16, and transmitted into a pre-distortion linearizer 60 which pre-distorts the signal and transmits the signal into signal splitter 24. Signal splitter 24 splits the signal from pre-distortion linearizer 60 into two substantially similar input signals, and transmits these signals into main amplifier 12 and auxiliary path phase offset 26. The signal from auxiliary path phase offset 26 is transmitted into auxiliary amplifier 14. The output signal from main amplifier 12 is then passed from main amplifier 12 through a main amplifier impedance transformer 22 and becomes a modified output from main amplifier 12. The modified output of main amplifier 12 to main amplifier impedance transformer 22 combines with the output of the signal from auxiliary amplifier 14, becomes the output signal, and exits enhanced amplification unit 10 through output signal line 18. In addition, a feedback signal line 62 is connected from the output signal line 18 to the signal preparation unit 20, which allows pre-distortion linearizer 60 to monitor the signal in output signal line 18.

The output signal which is created from main amplifier impedance transformer 22 and the output from auxiliary amplifier 14 should, in some embodiments, be in phase. This may be accomplished in any way known to one skilled in the art, including, but not limited to, realigning the phasing using baseband/digital delay techniques, or through length of track radio frequency techniques. Baseband/digital delay techniques are intended to refer to any delay techniques that include, but are not limited to, those that digitally delay the transmission of signals, and radio frequency techniques are intended to refer to any method involving radio frequency signals, including, but not limited to, adjusting the length of the signal track or path. Feedback signal line 62 allows signal preparation unit 20 to monitor the signal leaving enhanced amplification unit 10, and to make adjustments to pre-distortion linearizer 60 or signal splitter 24 or auxiliary path phase offset 26.

Figure 7:
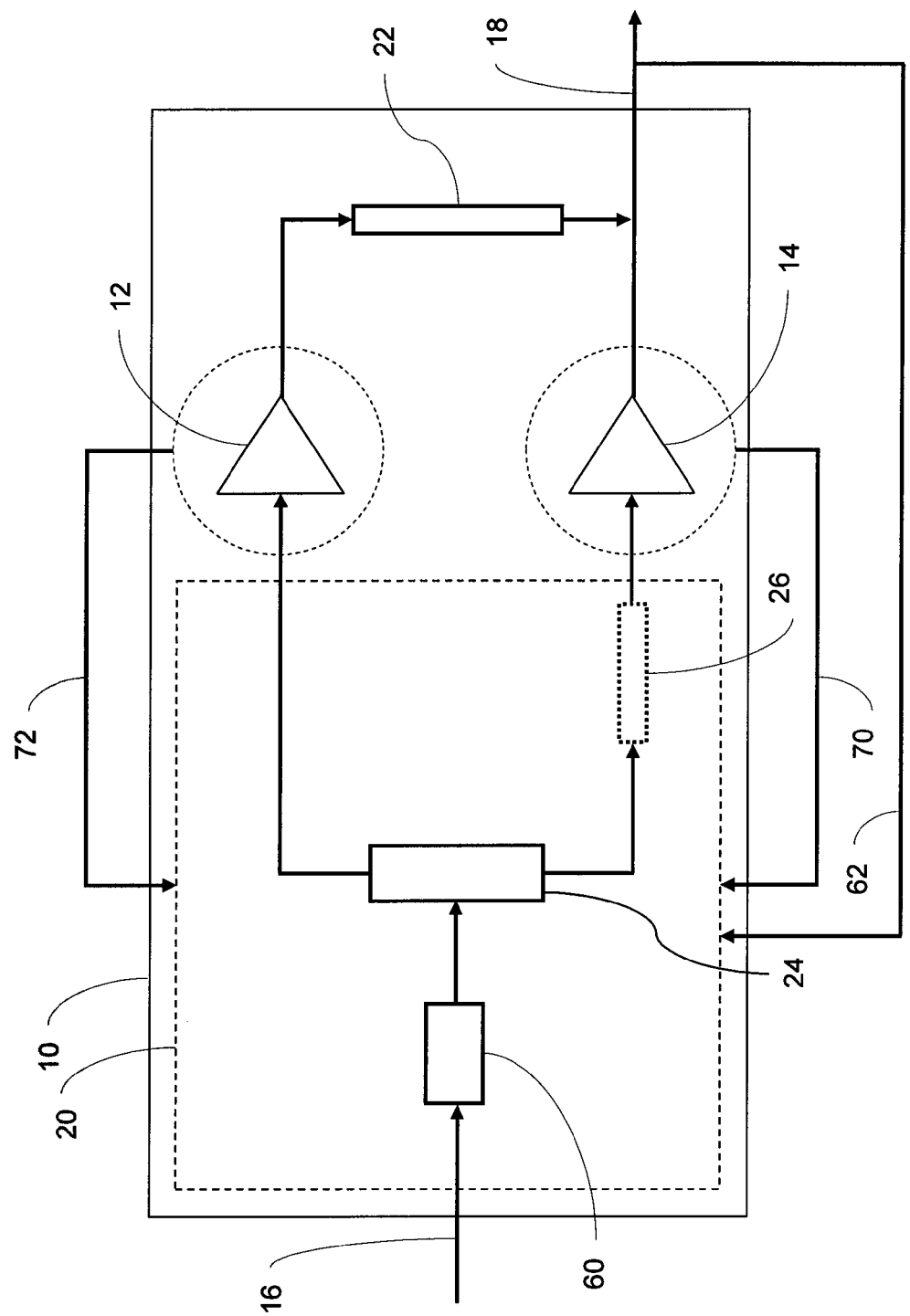
FIG. 7 is a block diagram of an alternative embodiment of an enhanced amplification unit with main path, auxiliary path and output signal feedback and a pre-distortion linearizer.

An embodiment of an enhanced amplification unit 10 is shown by FIG. 7 which has two additional feedback signal lines. In addition to the embodiment illustrated by FIG. 6, in this embodiment a main amplifier feedback line 72 provides information regarding the state of main amplifier 12 to signal preparation unit 20, and an auxiliary amplifier feedback line 70 provides information regarding the state of auxiliary amplifier 14 to signal preparation unit 20. This embodiment allows signal preparation unit 20 to monitor the signal in output signal line 18 as well as the state of main amplifier 12 and auxiliary amplifier 14 and to make adjustments to pre-distortion linearizer 60 or signal splitter 24 or auxiliary path phase offset 26.

Figure 8:
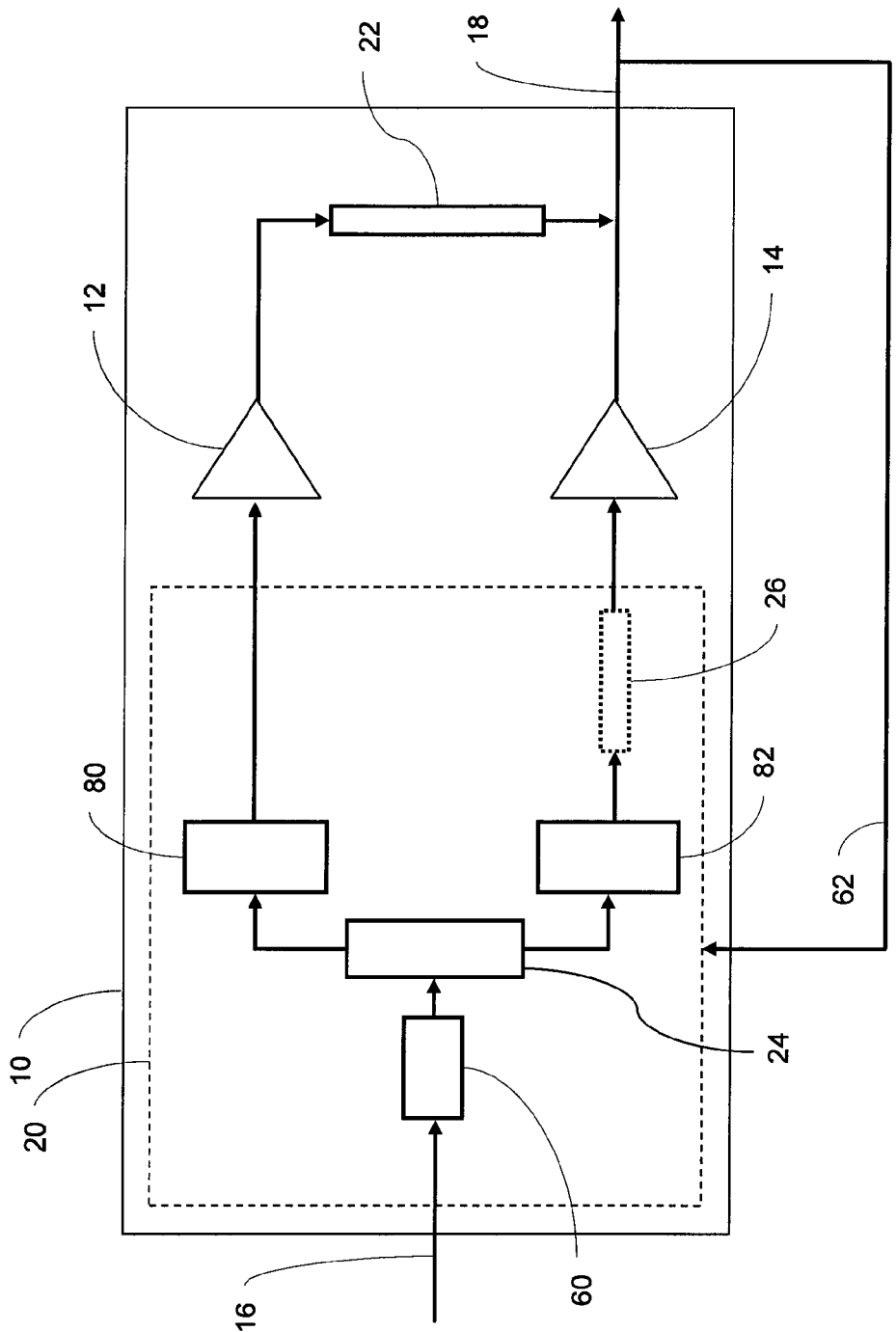
FIG. 8 is a block diagram of an alternative embodiment of an enhanced amplification unit with output signal feedback and a pre-distortion linearizer with main and auxiliary path signal shaping.

An embodiment of an enhanced amplification unit 10 is shown by FIG. 8. This embodiment of enhanced amplification unit 10 also includes a main path signal shaping device 80 and an auxiliary path signal shaping device 82. In this embodiment, a signal line is introduced into input signal line 16, and passed into pre-distortion linearizer 60. Pre-distortion linearizer 60 transmits the pre-distorted signal into signal splitter 24. Signal splitter 24 splits the signal from pre-distortion linearizer 60 into two substantially similar signals and then transmits one of these two signals into main path signal shaping device 80 and the other signal into auxiliary path signal shaping device 82. Main path signal shaping device 80 shapes the signal and then transmits the signal into main amplifier 12; main amplifier 12 amplifies the signal and transmits the signal to main amplifier impedance transformer 22. Auxiliary path signal shaping device 82 shapes the signal, then transmits the signal into auxiliary path phase offset 26, and transmits the signal to auxiliary amplifier 14. Again, the amplifier designs of the main and auxiliary amplifiers are dissimilar. The output from the main amplifier impedance transformer 22 combines with the output of the signal from auxiliary amplifier 14, becomes the output signal, and exits the enhanced amplification unit 10 through output signal line 18. In addition, a feedback signal line 62 is connected from output signal line 18 to signal preparation unit 20, which allows signal preparation unit 20 to monitor signal in output signal line 18 and to make adjustments to pre-distortion linearizer 60 or signal splitter 24 or main path signal shaping device 80 or auxiliary path signal shaping device 82 or auxiliary path phase offset 26.

Figure 9:
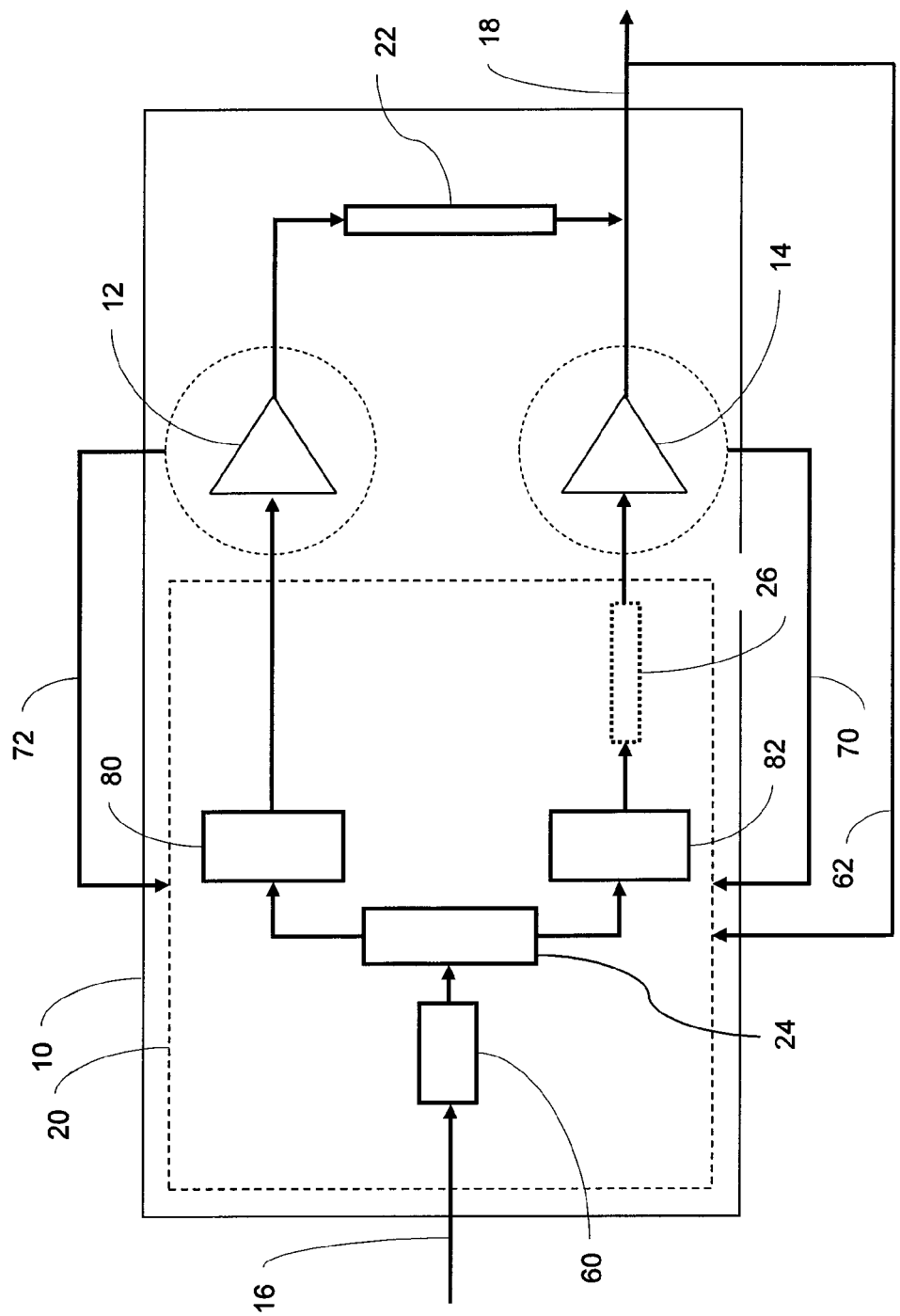
FIG. 9 is a block diagram of an alternative embodiment of an enhanced amplification unit with main path, auxiliary path and output signal feedback and a pre-distortion linearizer with main and auxiliary path signal shaping.

An embodiment of an enhanced amplification unit 10 is shown by FIG. 9 which has two additional feedback signal lines. In addition to embodiment illustrated by FIG. 8, in this embodiment a main amplifier feedback line 72 provides information regarding the state of main amplifier 12 to signal preparation unit 20, and an auxiliary amplifier feedback line 70 provides information regarding the state of auxiliary amplifier 14 to signal preparation unit 20. This embodiment allows signal preparation unit 20 to monitor the signal in output signal line 18 as well as the state of main amplifier 12 and auxiliary amplifier 14 and to make adjustments to pre-distortion linearizer 60 or signal splitter 24 or main path signal shaping device 80 or auxiliary path signal shaping device 82 or auxiliary path phase offset 26.

Figure 10A:
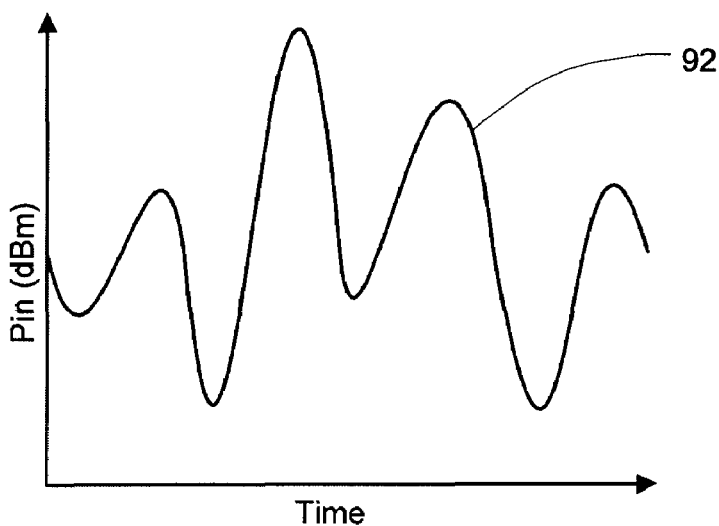
FIG. 10A is graphical representation of an input signal.
Figure 10B:
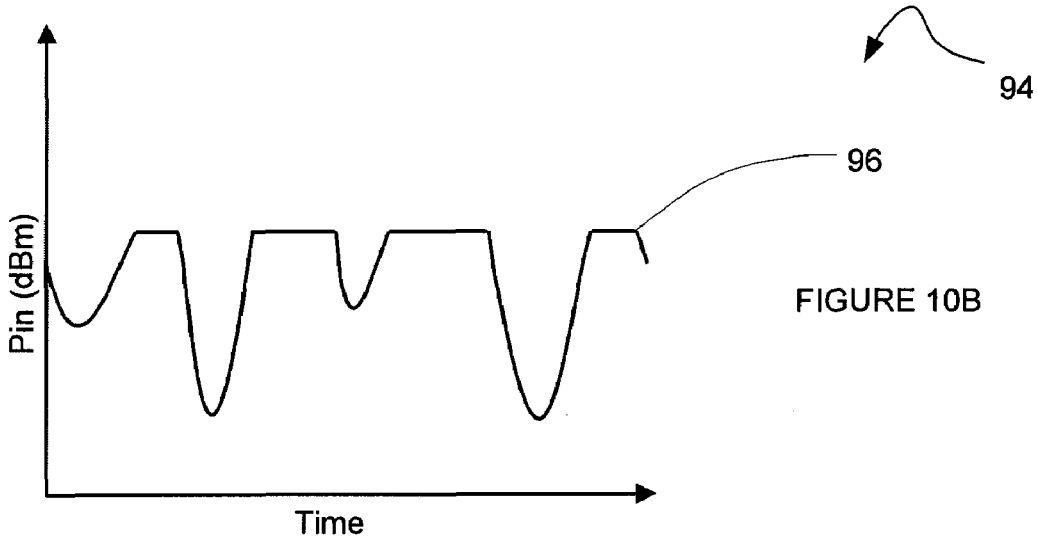
FIG. 10B is graphical representation of a main portion of a pre-shaped input signal.
Figure 10C:
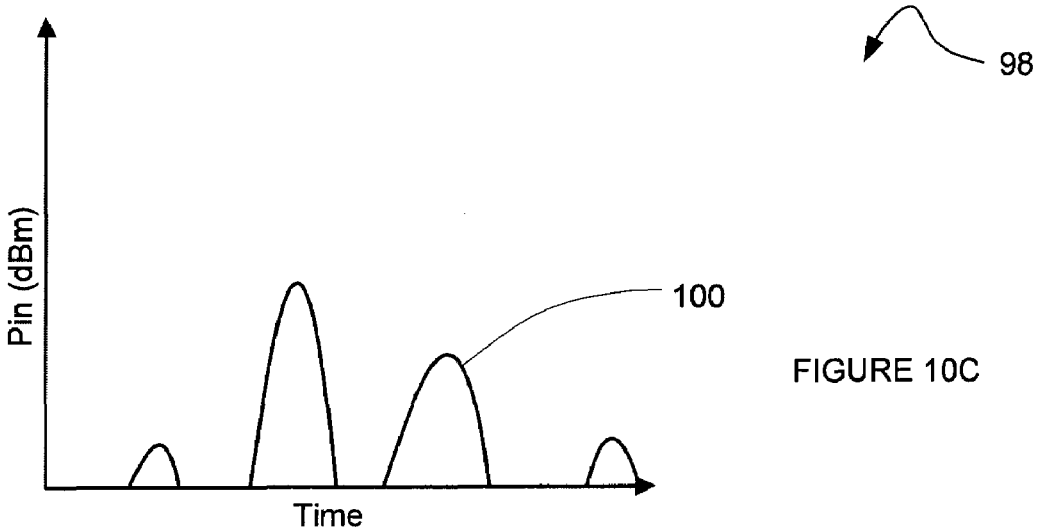
FIG. 10C is graphical representation of an auxiliary portion of a pre-shaped input signal.

Signal shaping may result in two RF input signals developed digitally for amplification in enhanced amplification unit 10. Signal splitter 24 splits a given signal into two substantially similar signals. The main path signal shaping device 80 shapes the first signal into a base portion while the auxiliary signal shaping device 82 shapes the second signal into a peak portion. An example wave form demonstrating shaping is shown in FIGS. 10A, 10B, and 10C, which are plots of input power (Pin) as a function of time. FIG. 10A is a plot 90 of an input signal 92. FIG. 10B is a plot 94 of main portion 96 of input signal 92. FIG. 10C is a plot 98 of auxiliary portion 100 of input signal 92. Main portion 96 may comprise the portion of input signal 92 that may be amplified by main amplifier 12 without reaching the saturation point. Auxiliary portion 100 comprises the portion of input signal 92 remaining after main portion 96 has been separated, and auxiliary portion 100 may comprise the portion of input signal 92 that may be amplified by auxiliary amplifier 14. Signal preparation unit 20 may be capable of a customized transfer of power to each amplifier. In some embodiments, pre-distortion linearizer 60 may also be designed to implement some form of pre-distortion to account for any non-linearity introduced by signal shaping in enhanced amplification unit 10 output.

Figure 11:
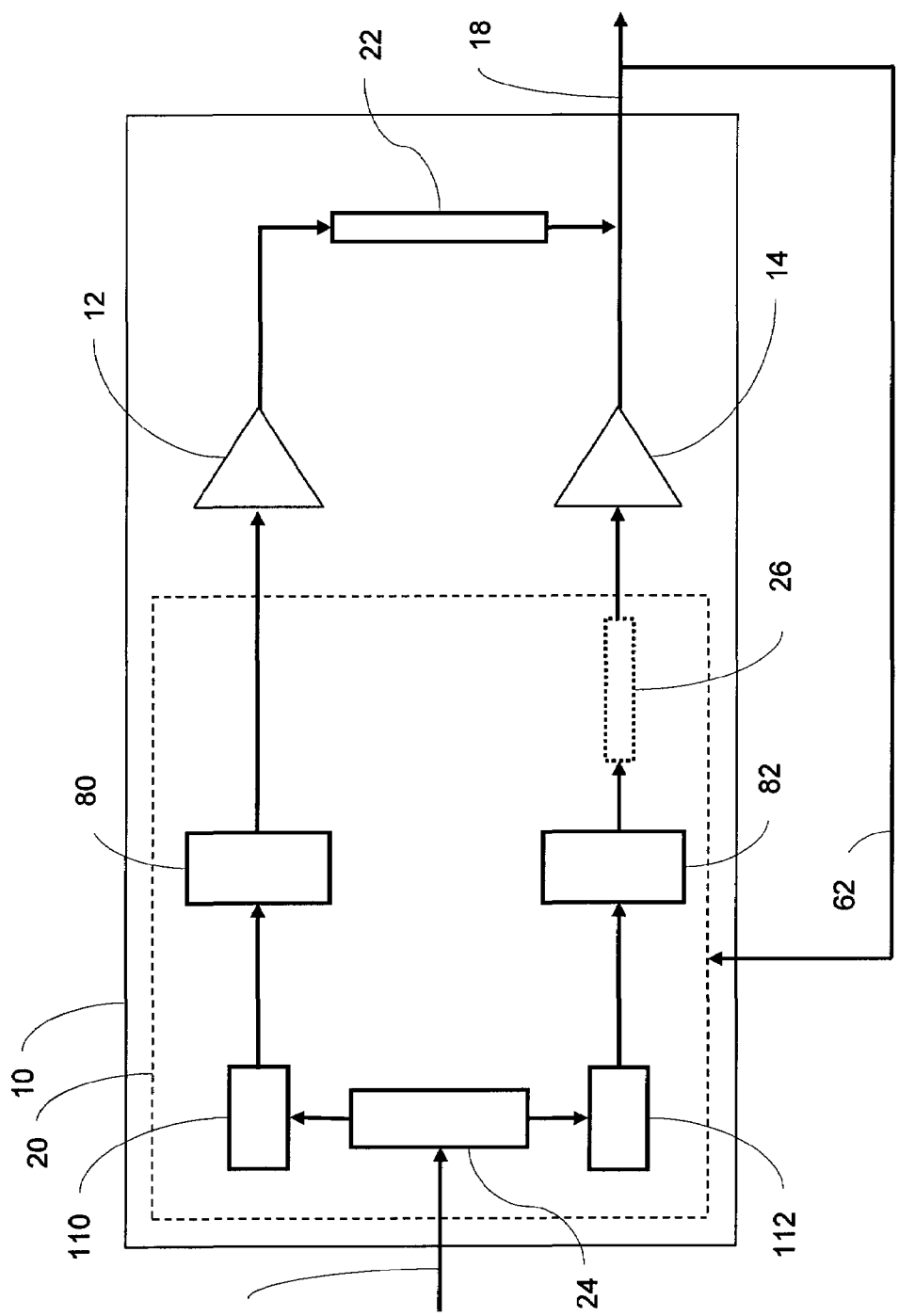
FIG. 11 is a block diagram of an alternative embodiment of an enhanced amplification unit with main and auxiliary path pre-distortion and signal shaping and output signal feedback.

An embodiment of an enhanced amplification unit 10 is shown by FIG. 11. This embodiment of enhanced amplification unit 10 is similar to the embodiment shown in FIG. 8, with the addition of a main path pre-distortion linearizer 110 placed in the main amplification path, and an auxiliary path pre-distortion linearizer 112 placed into the auxiliary amplification path, and without pre-distortion linearizer 60. In this embodiment, an input signal is introduced into input signal line 16 and passed into signal splitter 24. Signal splitter 24 splits the signal from input signal line 16 into two substantially similar signals, and then transmits one of these two signals into main path pre-distortion linearizer 110 and the other signal into auxiliary path pre-distortion linearizer 112. Main path pre-distortion linearizer 110 performs a pre-distortion linearizer signal transformation and transmits the signal into main path signal shaping device 80. Auxiliary path pre-distortion linearizer 112 performs a pre-distortion linearizer signal transformation and transmits the signal into auxiliary path signal shaping device 82. Main path signal shaping device 80 shapes the signal, and then transmits the signal into main amplifier 12; main amplifier 12 amplifies the signal and transmits the signal to main amplifier impedance transformer 22. Auxiliary path signal shaping device 82 shapes the signal and then transmits the signal into auxiliary path phase offset 26, and transmits the signal to auxiliary amplifier 14. Again, the amplifier designs of main amplifier 12 and auxiliary amplifier 14 are dissimilar. The output from main amplifier impedance transformer 22 combines with the output of the signal from the auxiliary amplifier 14, becomes the output signal, and exits the enhanced amplification unit 10 output through output signal line 18. In addition, a feedback signal line 62 is connected from output signal line 18 to signal preparation unit 20, which allows signal preparation unit 20 to monitor the signal in output signal line 18 and to make adjustments to pre-distortion linearizer 60 or signal splitter 24 or main path pre-distortion linearizer 110 or main path signal shaping device 80 or auxiliary path pre-distortion linearizer 112 or auxiliary path signal shaping device 82 or auxiliary path phase offset 26.

Main path pre-distortion linearizer 110 and auxiliary path pre-distortion linearizer 112 may be implemented as any device capable of applying distortion to an input signal based on an outgoing signal sample. For the purpose of clarity, when referring to distortion or pre-distortion, the terms are intended to refer to an intentional change to a signal. Distortion may be applied in any way known to one skilled in the art. In the example shown in FIG. 11, main path pre-distortion linearizer 110 and auxiliary path pre-distortion linearizer 112 are used to apply a predistrortion to the input signal transmitted through input signal line 16 based on a sample of the output signal in output signal line 18. Pre-distortion linearization is typically the application of an inverse phase or amplitude distortion which it is known and will be applied by main amplifier 12, auxiliary amplifier 14, and any other enhanced amplification unit 10 components as the signal transmits through enhanced amplification unit 10. Thus, by applying the inverse distortion to the signal before amplification, the sum of the pre-distortion and the inherent non-linearity of enhanced amplification unit 10 result in a reduction in the distortion in output signal line 18. In an embodiment, main path pre-distortion linearizer 110 and auxiliary path pre-distortion linearizer 112 may apply a pre-distortion to the input signal while the input signal is digital or analog. As further discussed herein, it should be expressly understood that any number of pre-distortion linearizer devices, including any number of pre-distortion linearizer devices with memory correction wherein the input signal is pre-distorted to account for device non-linearities and memory when operating within the desired range, could be used with any number of amplifier devices consistent with the present disclosure.

Figure 12:
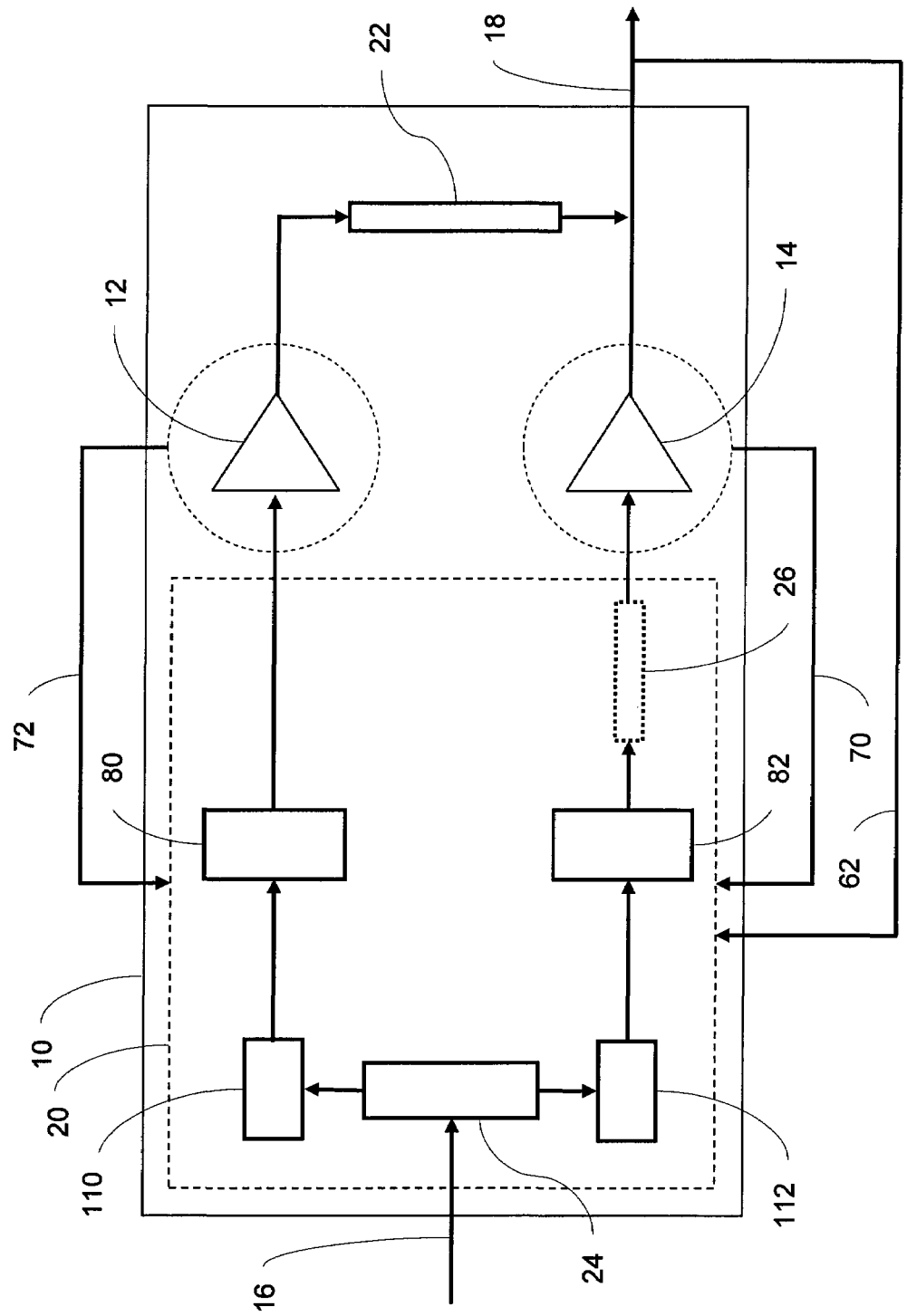
FIG. 12 is a block diagram of an alternative embodiment of an enhanced amplification unit with main and auxiliary path pre-distortion and signal shaping and main path, auxiliary path and output signal feedback.

An embodiment of an enhanced amplification unit 10 is shown by FIG. 12 which has two additional feedback signal lines. In addition to the embodiment illustrated by FIG. 11, in this embodiment a main amplifier feedback line 72 provides information regarding the state of main amplifier 12 to signal preparation unit 20, and an auxiliary amplifier feedback line 70 provides information regarding the state of auxiliary amplifier 14 to signal preparation unit 20. This embodiment allows signal preparation unit 20 to monitor the signal in output signal line 18 as well as the state of main amplifier 12 and auxiliary amplifier 14 and to make adjustments to signal splitter 24 or main path pre-distortion linearizer 110 or main path signal shaping device 80 or auxiliary path pre-distortion linearizer 112 or auxiliary path signal shaping device 82 or auxiliary path phase offset device 26.

Figure 13:
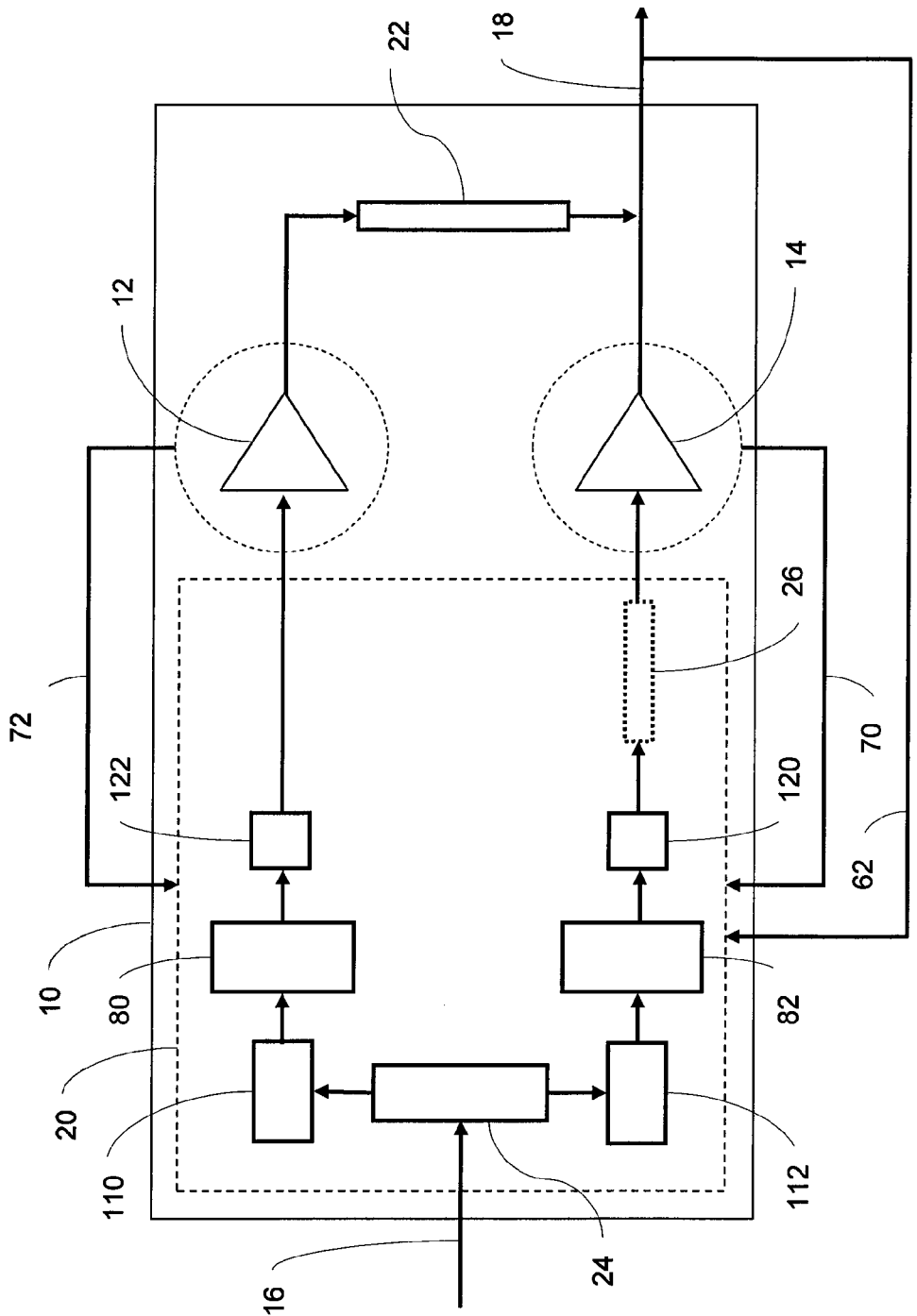
FIG. 13 is a block diagram of embodiment of an enhanced amplification unit with main and auxiliary path pre-distortion, signal shaping and up-conversion and main path, auxiliary path and output signal feedback.

FIG. 13 is yet another embodiment of enhanced amplification unit 10. The embodiment shown in FIG. 13 is substantially similar to the embodiment of FIG. 12, and contains the addition of a main up-conversion device 122 and an auxiliary up-conversion device 120. Main up-conversion device 122 may be placed at any point along the main amplifier path, and the auxiliary up-conversion device 120 may be placed at any point along the auxiliary amplifier path. The addition of the main up-conversion device 122 and auxiliary up-conversion device 120 are used to perform an up-conversion process on the signal in either the main amplification path, auxiliary amplification path, or both the main amplification path and auxiliary amplification path.

Figure 14:
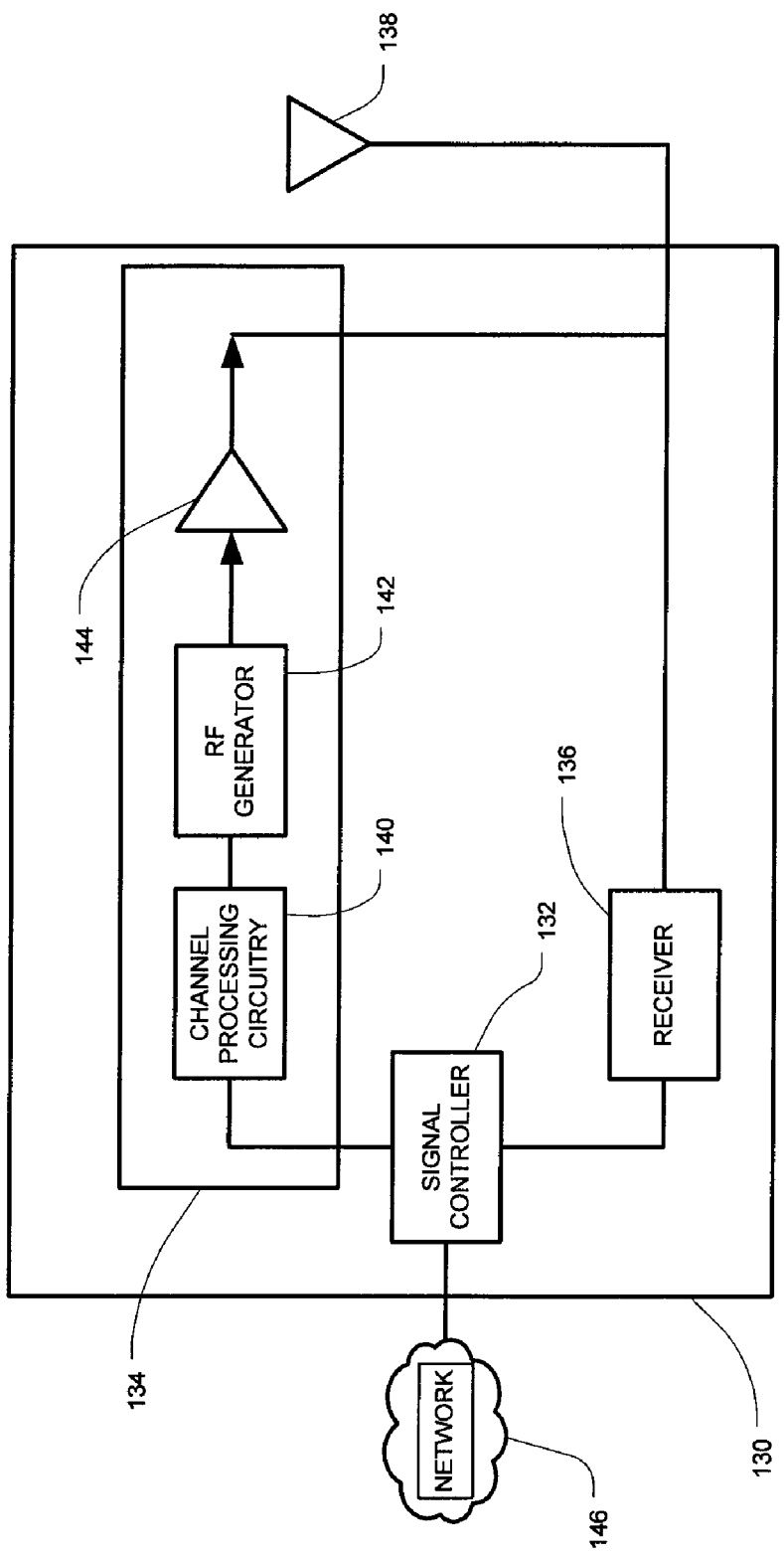
FIG. 14 is a block diagram of a base station.

As shown in FIG. 14, disclosed enhanced amplification unit 10 design may be incorporated into a base station 130. Base station 130 is a medium to high-power multi-channel, two-way radio in a fixed location. It may typically be used by low-power, single-channel, two-way radios or wireless devices such as mobile phones, portable phones and wireless routers. Base station 130 may comprise a signal controller 132 that is coupled to a transmitter 134 and a receiver 136. Transmitter 134 and receiver 136 (or combined transceiver) is further coupled to an antenna 138. In base station 130, digital signals are processed in signal controller 132. The digital signals may be signals for a wireless communication system, such as signals that convey voice or data intended for a mobile terminal (not shown). Base station 130 may employ any suitable wireless technologies or standards such as 2G, 2.5G, 3G, GSM, IMT-2000, UMTS, iDEN, GPRS, EV-DO, EDGE, DECT, PDC, TDMA, FDMA, CDMA, W-CDMA, TD-CDMA, TD-SCDMA, GMSK, OFDM, etc. Signal controller 132 then transmits the digital signals to transmitter 134, which includes a channel processing circuitry 140. Channel processing circuitry 140 encodes each digital signal, and a radio frequency (RF) generator 142 modulates the encoded signals onto an RF signal. The RF signal is then amplified in an enhanced amplification unit 10. The resulting output signal is transmitted over antenna 138 to the mobile terminal. Antenna 138 also receives signals sent to base station 130 from the mobile terminal. Antenna 138 transmits the signals to receiver 136 that demodulates them into digital signals and transmits them to signal controller 132 where they may be relayed to an external network 146. Base station 130 may also comprise auxiliary equipment such as cooling fans or air exchangers for the removal of heat from base station 130.

In an embodiment, the enhanced amplification unit 10 of the present disclosure may be incorporated into base station 130 in lieu of parts, if not all, of blocks 142 and 144, which may decrease the capital costs and power usage of base station 130. The power amplifier efficiency measures the usable output signal power relative to the total power input. The power not used to create an output signal is typically dissipated as heat. In large systems such as base station 130, the heat generated in enhanced amplification unit 10 may require cooling fans and other associated cooling equipment that may increase the cost of base station 130, require additional power, increase the overall size of the base station housing, and require frequent maintenance. Increasing the efficiency of enhanced amplification unit 10 in base station 130 may eliminate the need for some or all of the cooling equipment. Further, the supply power to enhanced amplification unit 10 may be reduced since it may more efficiently be converted to a usable signal. The physical size of base station 130 and the maintenance requirements may also be reduced due to the reduction of cooling equipment. This may enable base station 130 equipment to be moved to the top of a base station tower, allowing for shorter transmitter cable runs and reduced costs. In an embodiment, base station 130 has an operating frequency ranging from 800 MHz to 3.5 GHz.

While preferred embodiments of the invention have been shown and described, modifications thereof can be made by one skilled in the art without departing from the spirit and teachings of the invention. The embodiments described herein are exemplary only, and are not intended to be limiting. Many variations and modifications of the invention disclosed herein are possible and are within the scope of the invention. Where numerical ranges or limitations are expressly stated, such express ranges or limitations should be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). Use of the term "optionally" with respect to any element of a claim is intended to mean that the subject element is required, or alternatively, is not required. Both alternatives are intended to be within the scope of the claim. Use of broader terms such as comprises, includes, having, etc. should be understood to provide support for narrower terms such as consisting of, consisting essentially of, comprised substantially of, etc.

Accordingly, the scope of protection is not limited by the description set out above but is only limited by the claims which follow, that scope including all equivalents of the subject matter of the claims. Each and every claim is incorporated into the specification as an embodiment of the present invention. Thus, the claims are a further description and are an addition to the preferred embodiments of the present invention. The discussion of a reference in the Description of Related Art is not an admission that it is prior art to the present invention, especially any reference that may have a publication date after the priority date of this application. The disclosures of all patents, patent applications, and publications cited herein are hereby incorporated by reference, to the extent that they provide exemplary, procedural or other details supplementary to those set forth herein.

What we claim is:

1. An amplification unit comprising:
a signal splitter, wherein the signal splitter is operable to split an input signal into a first signal and a second signal such that the two resulting signal portions are in quadrature;
a main amplifier, wherein the main amplifier is capable of amplifying the first signal to produce a first amplified signal;
an auxiliary amplifier, wherein the auxiliary amplifier is capable of amplifying the second signal to produce a second amplified signal, and the auxiliary amplifier is substantially dissimilar from the main amplifier; and
a signal combiner, wherein the signal combiner is capable of combining the first amplified signal and the second amplified signal and realigning the phase of the first amplified signal and the second amplified signal, wherein the main and auxiliary amplifiers are formed utilizing semiconductor device technologies selected from the group comprising: a laterally diffused metal oxide semiconductor (LDMOS), a complementary metal oxide semiconductor (CMOS), a metal oxide semiconductor field effect transistor (MOSFET), a metal semiconductor field effect transistor (MESFET), a heterojunction bipolar transistor (HBT), a high electron mobility transistor (HEMT), heterojunction field effect transistor (HFET), a bipolar junction transistor (BJT), or combination thereof, wherein the main and auxiliary amplifiers are comprised of semiconductor materials selected from the group comprising: silicon (Si), indium phosphide (InP), gallium arsenide (GaAs), or gallium nitride (GaN), or combination thereof, and further comprising linearization with memory correction wherein the input signal is pre-distorted to account for device non-linearities and memory when operating within the desired range.

2. The amplification unit of claim 1 further comprising a pre-distortion linearizer coupled to the input signal line and providing an output signal to the signal splitter.

3. The amplification unit of claim 2 further comprising a feedback signal line, which includes a signal representative of the state of the output signal, to the pre-distortion linearizer, the signal splitter or both the pre-distortion linearizer and signal splitter.

4. The amplification unit of claim 2 further comprising a first signal shaping device receiving a first output signal from the signal splitter and coupled to the main amplifier path.

5. The amplification unit of claim 4 further comprising a second signal shaping device receiving a second output signal from the signal splitter and coupled to the auxiliary amplifier path such that the main and auxiliary amplifiers are driven in quadrature.

6. The amplification unit of claim 5 further comprising a first feedback signal line, which contains information regarding the state of the main amplifier, to the pre-distortion linearizer or the signal splitter or the first or second signal shaping devices or any combination thereof.

7. The amplification unit of claim 6 further comprising a second feedback signal line, which contains information regarding the state of the auxiliary amplifier, to the pre-distortion linearizer or the signal splitter or the first or second signal shaping devices or any combination thereof.

* * * * *